United States Patent
Kwong et al.

(10) Patent No.: US 7,107,673 B2
(45) Date of Patent: Sep. 19, 2006

(54) TECHNIQUE FOR ACCOMMODATING ELECTRONIC COMPONENTS ON A MULTIPLAYER SIGNAL ROUTING DEVICE

(75) Inventors: Herman Kwong, Kanata (CA); Luigi Difilippo, Kanata (CA); Guy Duxbury, Nepean (CA); Larry Marcanti, Allen, TX (US)

(73) Assignee: Nortel Networks Limited, St. Laurent ( * ) Notice: Subject to any disclaimer, the term of this patent is extended or adjusted under 35 U.S.C. 154(b) by 327 days.

(21) Appl. No.: 10/716,599

(22) Filed: Nov. 20, 2003

(65) Prior Publication Data
US 2004/0099440 A1   May 27, 2004

Related U.S. Application Data

(63) Continuation-in-part of application No. 10/101,211, filed on Mar. 20, 2002, which is a continuation-in-part of application No. 09/651,188, filed on Aug. 30, 2000, now Pat. No. 6,388,890, application No. 10/716,599, which is a continuation-in-part of application No. 10/326,123, filed on Dec. 23, 2002, which is a continuation-in-part of application No. 10/101,211, filed on Mar. 20, 2002, and a continuation-in-part of application No. 10/126,700, filed on Apr. 22, 2002, now Pat. No. 6,545,876, which is a continuation of application No. 09/651,188, filed on Aug. 30, 2000, now Pat. No. 6,388,890, application No. 10/716,599, which is a continuation-in-part of application No. 10/326,079, filed on Dec. 23, 2002, which is a continuation-in-part of application No. 10/126,700, filed on Apr. 22, 2002, now Pat. No. 6,545,876, and a continuation-in-part of application No. 10/101,211, filed on Mar. 20, 2002, application No. 10/716,599, which is a continuation-in-part of application No. 10/407,460, filed on Apr. 7, 2003, which is a continuation-in-part of application No. 10/126,700, filed on Apr. 22, 2002, now Pat. No. 6,545,876, and a continuation-in-part of application No. 10/101,211, filed on Mar. 20, 2002, and a continuation-in-part of application No. 10/326,123, filed on Dec. 23, 2002, and a continuation-in-part of application No. 10/326,079, filed on Dec. 23, 2002.

(60) Provisional application No. 60/427,865, filed on Nov. 20, 2002, provisional application No. 60/212,387, filed on Jun. 19, 2000.

(51) Int. Cl.
  *H05K 3/30*      (2006.01)
(52) U.S. Cl. ............................. 29/832; 29/830; 29/840; 29/846; 29/847
(58) Field of Classification Search .................. 29/825, 29/846, 847, 830, 832, 840
See application file for complete search history.

(56) References Cited

U.S. PATENT DOCUMENTS 5,006,820 A    4/1991   Prioste et al.

(Continued)

FOREIGN PATENT DOCUMENTS

JP          09223861          8/1997

(Continued)

OTHER PUBLICATIONS

"Printed Circuit Board Termination Board Termination Network For High Speed Signal", Research Disclosure, Kenneth Mason Publications, Hampshire, GB, No. 417, Jan. 1999, pp. 163-166, XP-000888521.

(Continued)

*Primary Examiner*—Carl J. Arbes
(74) *Attorney, Agent, or Firm*—Hunton & Williams LLP

(57) ABSTRACT

A technique for accommodating electronic components on a multilayer signal routing device is disclosed. In one particular exemplary embodiment, the technique may be realized as a method for accommodating electronic components on a multilayer signal routing device. Such a method comprises determining a component space that is required to accommodate a plurality of electronic components on a surface of a multilayer signal routing device, and then forming at least one signal routing channel on at least the surface of the multilayer signal routing device, wherein the at least one signal routing channel has a channel space that is equal to or greater than the component space.

10 Claims, 14 Drawing Sheets

U.S. PATENT DOCUMENTS

| | | | |
|---|---|---|---|
| 5,281,151 A | 1/1994 | Arima et al. | |
| 5,357,403 A * | 10/1994 | Haller et al. | 361/794 |
| 5,384,433 A | 1/1995 | Osann, Jr. et al. | |
| 5,451,721 A | 9/1995 | Tsukada et al. | |
| 5,544,018 A | 8/1996 | Sommerfeldt et al. | |
| 5,686,764 A | 11/1997 | Fulcher | |
| 6,194,668 B1 | 2/2001 | Horiuchi et al. | |
| 6,198,635 B1 | 3/2001 | Shenoy et al. | |
| 6,246,112 B1 * | 6/2001 | Ball et al. | 257/690 |
| 6,271,478 B1 | 8/2001 | Horiuchi et al. | |
| 6,310,398 B1 | 10/2001 | Katz | |
| 6,335,493 B1 | 1/2002 | Horiuchi et al. | |
| 6,365,975 B1 * | 4/2002 | DiStefano et al. | 257/777 |
| 6,388,890 B1 | 5/2002 | Kwong et al. | |
| 6,407,343 B1 | 6/2002 | Tanaka | |
| 6,452,262 B1 | 9/2002 | Juneja | |
| 6,521,846 B1 | 2/2003 | Freda et al. | |
| 6,545,876 B1 | 4/2003 | Kwong et al. | |
| 6,690,845 B1 * | 2/2004 | Yoshimura et al. | 385/14 |
| 2002/0008314 A1 | 1/2002 | Takeuchi | |
| 2003/0043560 A1 | 3/2003 | Clarkson et al. | |
| 2003/0183419 A1 | 10/2003 | Miller et al. | |

FOREIGN PATENT DOCUMENTS

| | | |
|---|---|---|
| WO | WO 0158224 | 8/2001 |

OTHER PUBLICATIONS

International Search Report dated May 10, 2004 for Application No. PCT/US03/37069.

* cited by examiner

TECHNIQUE FOR ACCOMMODATING ELECTRONIC COMPONENTS ON A MULTIPLAYER SIGNAL ROUTING DEVICE

CROSS-REFERENCE TO RELATED APPLICATIONS

This patent application claims priority to U.S. Provisional Patent Application No. 60/427,865, filed Nov. 20, 2002, which is hereby incorporated by reference herein in its entirety.

This patent application is a continuation-in-part patent application of U.S. patent application Ser. No. 10/101,211, filed Mar. 20, 2002, which is a continuation-in-part patent application of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000, all of which are hereby incorporated by reference herein in their entirety.

This patent application is also a continuation-in-part patent application of U.S. patent application Ser. No. 10/326,123, filed Dec. 23, 2002, which is a continuation-in-part patent application of the above-referenced U.S. patent application Ser. No. 10/101,211, and a continuation-in-part patent application of U.S. patent application Ser. No. 10/126,700, filed Apr. 22, 2002, now U.S. Pat. No. 6,545,876, which is a continuation of the above-referenced U.S. patent application Ser. No. 09/651,188, all of which are hereby incorporated by reference herein in their entirety.

This patent application is also a continuation-in-part patent application of U.S. patent application Ser. No. 10/326,079, filed Dec. 23, 2002, which is a continuation-in-part patent application of the above-referenced U.S. patent application Ser. No. 10/126,700, and a continuation-in-part patent application of the above-referenced U.S. patent application Ser. No. 10/101,211, all of which are hereby incorporated by reference herein in their entirety.

This patent application is also a continuation-in-part patent application of U.S. patent application Ser. No. 10/407,460, filed Apr. 7, 2003, which is a continuation-in-part patent application of the above-referenced U.S. patent application Ser. No. 10/126,700, a continuation-in-part application of the above-referenced U.S. patent application Ser. No. 10/101,211, a continuation-in-part patent application of the above-referenced U.S. patent application Ser. No. 10/326,123, and a continuation-in-part patent application of the above-referenced U.S. patent application Ser. No. 10/326,079, all of which are hereby incorporated by reference herein in their entirety.

FIELD OF THE INVENTION

The present invention relates generally to multilayer signal routing devices and, more particularly, to a technique for accommodating electronic components on a multilayer signal routing device.

BACKGROUND OF THE INVENTION

The making of electrical connections between electronic components has long been accomplished using printed circuit boards (PCBs). The first such circuit boards had only a single routing layer on a top surface thereof for routing electrical signals between electronic components mounted thereon. These single routing layer circuit boards have severe limitations with regard to the number of electrical signals that can be routed between electronic components mounted on the same circuit board. That is, the number of electrical signals that can be routed between electronic components mounted on a single routing layer circuit board is limited by the amount of area on the single routing layer.

The area limitations associated with single routing layer circuit boards led to the development of multilayer PCBs. Such multilayer PCBs may be either single or double-sided and may have multiple routing layers on the surface of and buried within the multilayer PCBs. Thus, such multilayer PCBs have allowed a large increase in the number of electrical signals that may be routed between electronic components mounted on the same circuit board.

The use of multilayer PCBs has been particularly beneficial when using electronic components having high-density packages. That is, electronic components having high-density packages generally require multiple layers of a multilayer PCB to make electrical connections with other electronic components mounted on the same circuit board. In fact, the density of electronic component packages typically dictates the number of layers that must be provided by the multilayer PCB upon which the electronic components are mounted. While the number of layers that may be provided by a multilayer PCB is theoretically unlimited, reliability and other problems occur when the number of layers in a multilayer PCB exceeds a reasonable number, particularly when trying to route high-speed electrical signals between electronic components. For example, when making electrical connections between different layers in multilayer PCBs, a combination of electrically conductive traces and electrically conductive vias are generally used. While electrically conductive vias allow direct vertical electrical connections to be made between different layers within a multilayer PCB, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. In addition, these intrinsic parasitics can also have an adverse effect on the manufacturability of a PCB and thus the cost thereof. Because of their adverse affect on signal performance, these intrinsic parasitics can also limit the bandwidth of signals propagating along each electrically conductive via. These adverse affects only increase as the number of layers in a multilayer PCB increase.

To alleviate at least some of the above-mentioned adverse effects, it is often helpful to have resistive, capacitive, and/or inductive components electrically connected in series and/or parallel with an electrically conductive via, which is also electrically connected to a signal driver contact of an electronic component. However, this if often difficult to achieve since the signal driver contact may be located within the interior of a contact array of the electronic component, and thus there is no place to mount the resistive, capacitive, and/or inductive components. Even if the signal driver contact is located along the periphery of a contact array of the electronic component, there may still be no place to mount the resistive, capacitive, and/or inductive components since electronic components are now being placed ever closer together on the surfaces of PCB's and other types of multilayer signal routing devices.

One proposed solution to the problem of mounting resistive, capacitive, and/or inductive components since electronic components near a signal driver contact of an electronic component is to bury or embed the resistive, capacitive, and/or inductive components within a PCB or other type of multilayer signal routing device. However, the cost and maturity of suitable technologies for this proposed solution make it impractical.

In view of the foregoing, it would be desirable to provide a technique for mounting resistive, capacitive, and/or inductive components on a multilayer signal routing device near a signal driver contact of an electronic component that overcomes the above-described inadequacies and shortcomings.

SUMMARY OF THE INVENTION

According to the present invention, a technique for accommodating electronic components on a multilayer signal routing device is provided. In one particular exemplary embodiment, the technique may be realized as a method for accommodating electronic components on a multilayer signal routing device. Such a method comprises determining a component space that is required to accommodate a plurality of electronic components on a surface of a multilayer signal routing device, and then forming at least one signal routing channel on at least the surface of the multilayer signal routing device, wherein the at least one signal routing channel has a channel space that is equal to or greater than the component space. The at least one signal routing channel formed on the surface of the multilayer signal routing device may have a vertical, horizontal, and/or diagonal orientation portion along the surface of the multilayer signal routing device.

In accordance with other aspects of this particular exemplary embodiment of the present invention, determining a component space may beneficially comprise determining a number of the plurality of electronic components that are to be mounted on the surface of the multilayer signal routing device, and then determining a required space for each of the number of the plurality of electronic components that are to be mounted on the surface of the multilayer signal routing device.

In accordance with further aspects of this particular exemplary embodiment of the present invention, forming at least one signal routing channel may beneficially comprise forming at least two relatively aligned electrically conductive micro-vias in the multilayer signal routing device coinciding with the location of the at least one signal routing channel formed on the secondary surface of the multilayer signal routing device.

In accordance with additional aspects of this particular exemplary embodiment of the present invention, wherein the surface of the multilayer signal routing device is a secondary surface of the multilayer signal routing device, a plurality of electrically conductive pads may beneficially be formed on a primary surface of the multilayer signal routing device opposite the secondary surface of the multilayer signal routing device. If such is the case, at least two relatively aligned electrically conductive micro-vias may beneficially be formed in the multilayer signal routing device in electrical connection with at least two respective ones of the electrically conductive pads and coinciding with the location of the at least one signal routing channel formed on the secondary surface of the multilayer signal routing device. At least a portion of the plurality of electronic components may beneficially be mounted on the secondary surface of the multilayer signal routing device within the at least one signal routing channel formed on the secondary surface of the multilayer signal routing device. Also, an electrically conductive pad may beneficially be formed on the secondary surface of the multilayer signal routing device within the at least one signal routing channel formed on the secondary surface of the multilayer signal routing device. If such is the case, at least one of the plurality of electronic components may beneficially be mounted on the secondary surface of the multilayer signal routing device in electrical connection with the electrically conductive pad formed on the secondary surface of the multilayer signal routing device and coinciding with the position of the at least one signal routing channel formed on the secondary surface of the multilayer signal routing device. Of course, an electrically conductive trace may also beneficially be formed on the secondary surface of the multilayer signal routing device electrically connected to the electrically conductive pad formed on the secondary surface of the multilayer signal routing device.

In another particular exemplary embodiment, the technique may be realized as a novel multilayer signal routing device. Such a multilayer signal routing device comprises a primary surface having a plurality of electrically conductive pads formed thereon, wherein a group of the plurality of electrically conductive pads is in respective electrical connection with a group of electrically conductive micro-vias formed in the multilayer signal routing device. Such a multilayer signal routing device also comprises a secondary surface having a signal routing channel formed thereon coinciding with the location of the group of electrically conductive micro-vias, wherein the signal routing channel has a channel area on the secondary surface for accommodating an electronic component mounted on the secondary surface. The signal routing channel may have a vertical, horizontal, and/or diagonal orientation portion along the secondary surface of the multilayer signal routing device.

In accordance with other aspects of this particular exemplary embodiment of the present invention, the secondary surface may beneficially have an electrically conductive pad formed thereon within the signal routing channel. If such is the case, the electronic component may beneficially be mounted on the secondary surface within the signal routing channel in electrical connection with the electrically conductive pad formed on the secondary surface. Of course, the secondary surface may beneficially have an electrically conductive trace formed thereon, wherein the electrically conductive trace is in electrical connection with the electrically conductive pad formed on the secondary surface.

The present invention will now be described in more detail with reference to exemplary embodiments thereof as shown in the accompanying drawings. While the present invention is described below with reference to exemplary embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

DETAILED DESCRIPTION OF EXEMPLARY EMBODIMENT(S)

At the outset, it is helpful to refer to the techniques for reducing the number of layers in a multilayer signal routing device as have been substantially described in the above-referenced U.S. Provisional Patent Application No. 60/212,387, the above-referenced U.S. patent application Ser. No. 09/651,188 (now U.S. Pat. No. 6,388,890), the above-referenced U.S. patent application Ser. No. 10/101,211, the above-referenced U.S. patent application Ser. No. 10/126,700 (now U.S. Pat. No. 6,545,876), the above-referenced U.S. patent application Ser. No. 10/326,123, the above-referenced U.S. patent application Ser. No. 10/326,079, and the above-referenced U.S. patent application Ser. No. 10/407,460, all of which have been incorporated by reference herein in their entirety.

The above-referenced techniques are certainly beneficial for reducing the number of layers in a multilayer signal routing device. However, these techniques may be even more beneficial if used in conjunction with one or more of the several techniques described herein.

Figure 1:
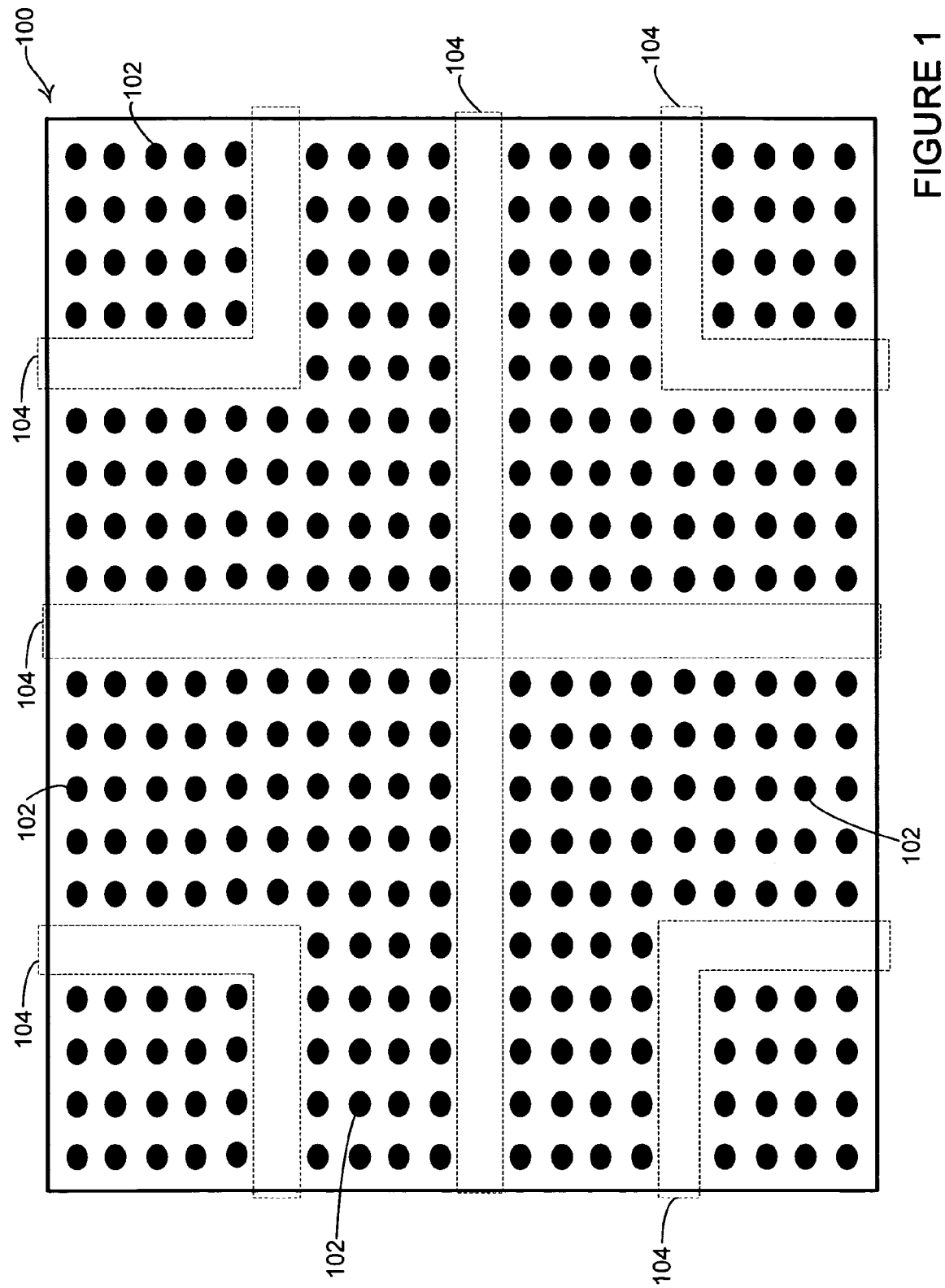
FIG. 1 shows a portion of a secondary side of a multilayer signal routing device having signal routing channels.

Referring to FIG. 1, there is shown a portion of a secondary side of a multilayer signal routing device 100. The multilayer signal routing device portion 100 comprises a plurality of electrically conductive pads 102 formed thereon, each of which is preferably electrically connected to an electrically conductive via (not shown) formed in the multilayer signal routing device portion 100. The plurality of electrically conductive pads 102, through respective ones of the electrically conductive vias, are electrically connected to electrically conductive pads (not shown) formed on a primary side (i.e., the opposite side) of the multilayer signal routing device portion 100. These electrically conductive pads formed on the primary side of the multilayer signal routing device portion 100 are electrically connected to electrically conductive contacts of an electronic component (not shown) that is mounted on the primary side of the multilayer signal routing device portion 100.

In the embodiment of FIG. 1, the electronic component that is mounted on the primary side of the multilayer signal routing device portion 100 has a 20×20 array of electrically conductive contacts formed thereon. As shown in FIG. 1, some of the electrically conductive contacts in the 20×20 array of electrically conductive contacts formed on the electronic component are not electrically connected to respective ones of the electrically conductive pads 102 formed on the secondary side of the multilayer signal routing device portion 100. Those electrically conductive contacts of the electronic component that are not electrically connected to respective ones of the electrically conductive pads 102 formed on the secondary side of the multilayer signal routing device portion 100 may instead be electrically connected to additional electrically conductive pads formed on the primary side of the multilayer signal routing device portion 100. These additional electrically conductive pads formed on the primary side of the multilayer signal routing device portion 100 may in turn be electrically connected to micro-vias (not shown) formed in the multilayer signal routing device portion 100. These micro-vias may be arranged to form signal routing channels 104 on the secondary side of the multilayer signal routing device portion 100, as well as within one or more internal layers of the multilayer signal routing device portion 100, as described in the above-referenced techniques for reducing the number of layers in a multilayer signal routing device.

At this point it should be noted that some of those electrically conductive contacts of the electronic component that are not electrically connected to respective ones of the electrically conductive pads 102 formed on the secondary side of the multilayer signal routing device portion 100 may not be electrically connected to any electrically conductive pads formed on the primary side of the multilayer signal routing device portion 100. For example, some of those electrically conductive contacts of the electronic component that are not electrically connected to respective ones of the electrically conductive pads 102 formed on the secondary side of the multilayer signal routing device portion 100 may be used for testing the electronic component when the electronic component is not mounted on the multilayer signal routing device portion 100.

While the signal routing channels 104 are very beneficial for reducing the number of layers in a multilayer signal routing device as described in the above-referenced techniques, the signal routing channels 104 may also be used to provide valuable space for mounting additional electronic components on the secondary side of the multilayer signal routing device portion 100 in accordance with an embodiment of the present invention. For example, referring to FIG. 2, there are shown multiple additional electronic components 106 mounted on the secondary side of the multilayer signal routing device portion 100 within the signal routing channels 104. As also shown in FIG. 2, the multiple additional electronic components 106 are electrically connected to respective ones of the electrically conductive pads 102 formed on the secondary side of the multilayer signal routing device portion 100 by electrical connections 108.

Figure 2:
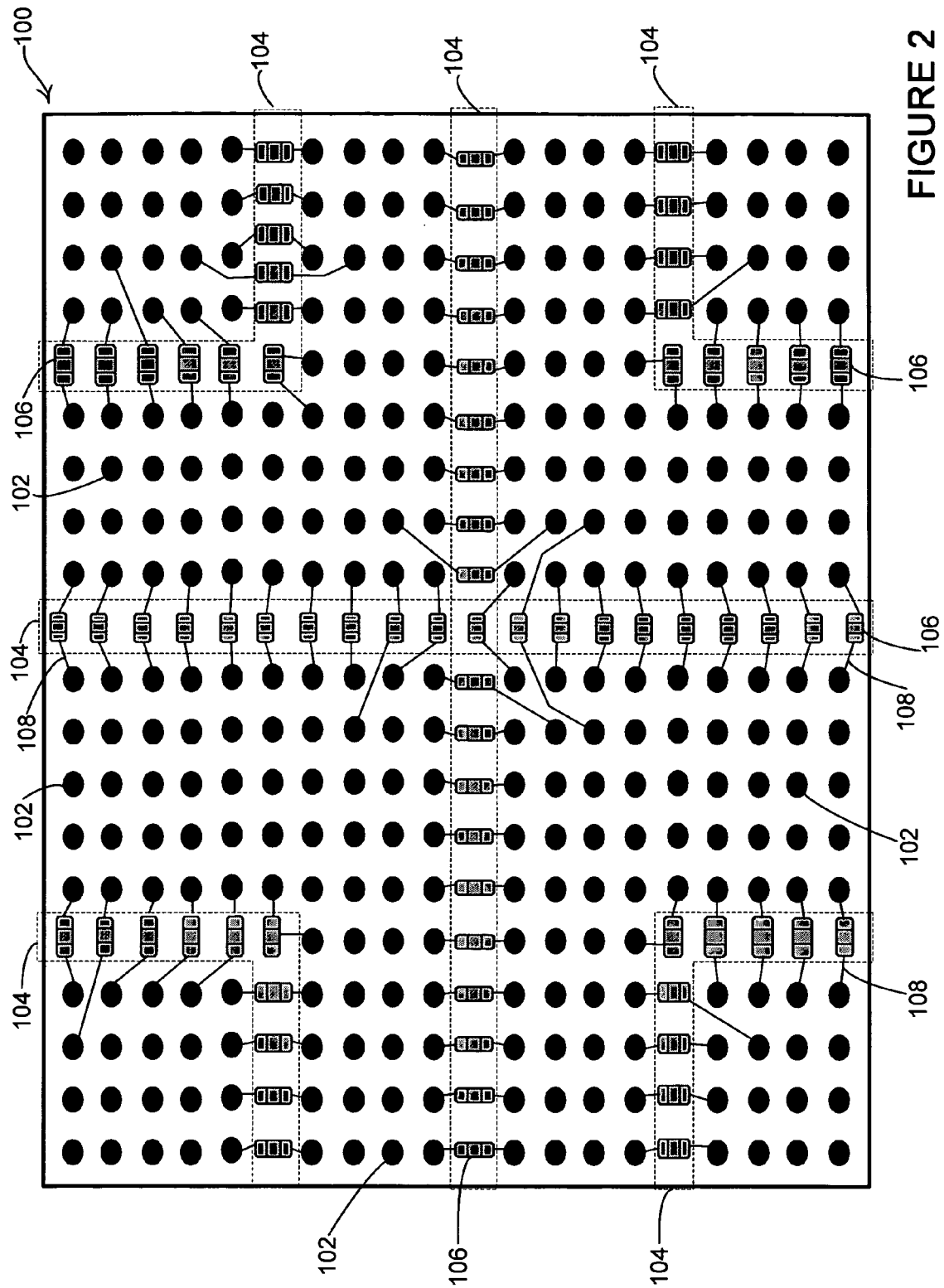
FIG. 2 shows the portion of the secondary side of the multilayer signal routing device of FIG. 1 having additional electronic components mounted in the signal routing channels in accordance with an embodiment of the present invention.
Figure 2A:
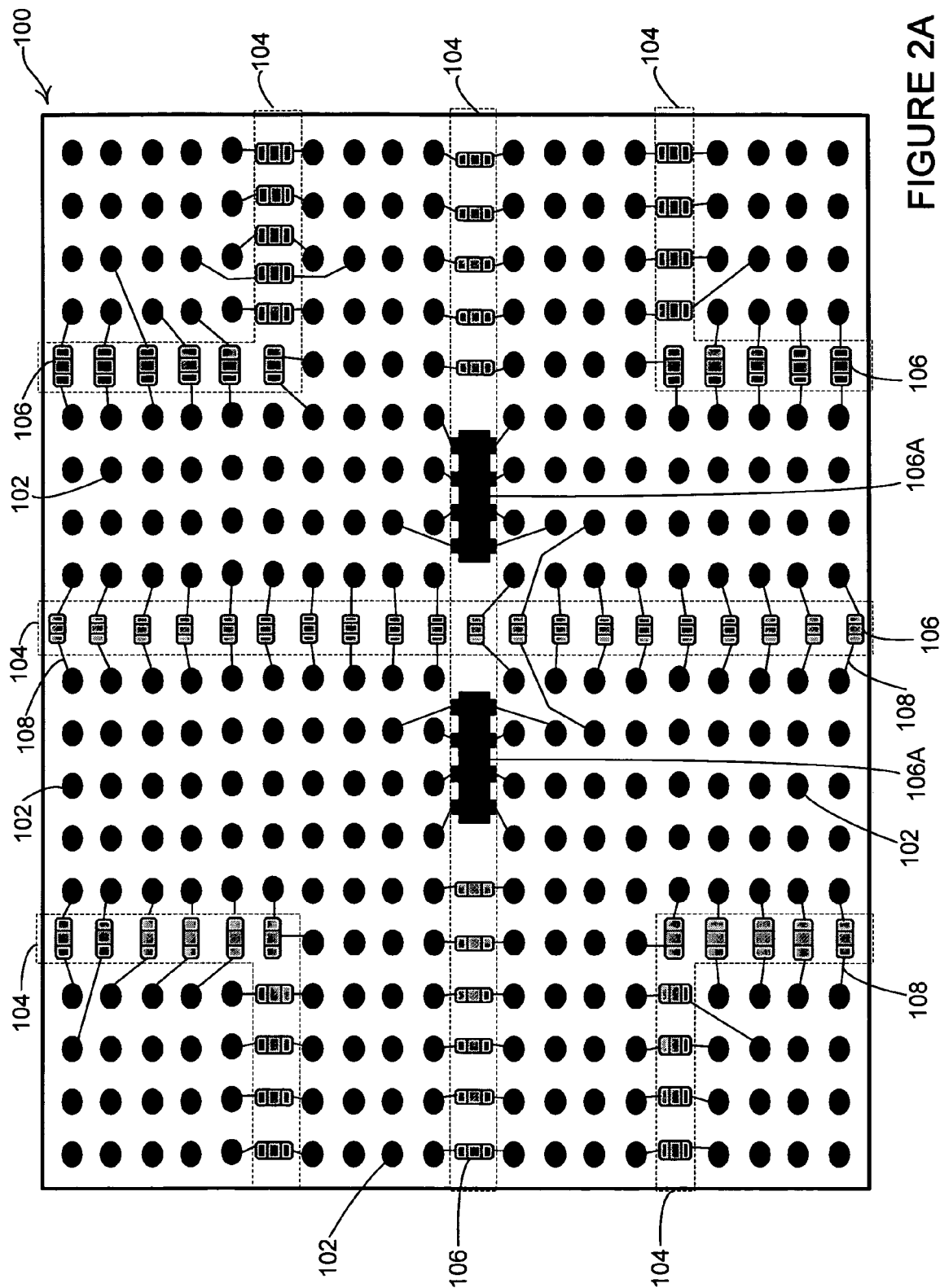
FIG. 2A shows the portion of the secondary side of the multilayer signal routing device of FIG. 1 having additional electronic components, including logic devices, mounted in the signal routing channels in accordance with an embodiment of the present invention.

At this point it should be noted that, as shown in FIG. 2, the multiple additional electronic components 106 may be discrete resistive, capacitive, and/or inductive components. Alternatively, as shown in FIG. 2A, one or more of the multiple additional electronic components 106A may be active electronic components such as, for example, logic circuitry.

It should also be noted that the electrical connections 108 may be electrically conductive traces formed on the secondary side of the multilayer signal routing device portion 100. In such a case, the multiple additional electronic components 106 may have electrically conductive contacts (e.g., surface mount pads) which may be mounted on respective mating electrically conductive pads (not shown) formed on the secondary side of the multilayer signal routing device portion 100. Of course, these mating electrically conductive pads formed on the secondary side of the multilayer signal routing device portion 100 are electrically connected to respective electrically conductive traces.

Alternatively, the electrical connections 108 may be electrically conductive leads associated with the multiple additional electronic components 106. In such a case, the multiple additional electronic components 106 may be mounted on the secondary side of the multilayer signal routing device portion 100 with a non-electrically conductive adhesive while the electrically conductive leads are separately electrically connected to respective ones of the electrically conductive pads 102. Indeed, the multiple additional electronic components 106 may even be mounted on top of surface mount components, which themselves are mounted on the secondary side of the multilayer signal routing device portion 100 within the signal routing channels 104, thereby forming stacked component structures so as to further increase component density on the multilayer signal routing device portion 100.

As shown in FIG. 2, the signal routing channels 104 may be used to provide valuable space for mounting the additional electronic components 106 on the secondary side of the multilayer signal routing device portion 100 in accordance with an embodiment of the present invention. An important benefit associated with the mounting of these additional electronic components 106 on the secondary side of the multilayer signal routing device portion 100 is that signal integrity may be improved when the additional electronic components 106 (e.g., resistive, capacitive, and/or inductive components) are mounted on the multilayer signal routing device 100 near a signal driver contact of the electronic component. An additional side benefit associated with the mounting of these additional electronic components 106 on the secondary side of the multilayer signal routing device portion 100 is that these additional electronic components 106 may be mounted in an orderly and logical fashion so as to facilitate troubleshooting in a laboratory environment.

At this point it should be noted that an empirical prediction may be made regarding the total amount of space that is required to accommodate all of the additional electronic components 106 that are required for a particular design. For example, assuming a worst case signal-to-ground ratio of 2:1, and that each signal must be attached to one of the additional electronic components 106, the total number of additional electronic components 106 required for an electronic component having M×N array of electrically conductive contacts formed thereon is approximately (M×N)/3. Thus, the total amount of space that is required to accommodate all of the additional electronic components 106 that are required for a particular design is (M×N)/3* (space required for the additional electronic component 106, including any required clearance surrounding the additional electronic component 106). Once the total amount of space is determined, the required number and size of signal routing channels 104 may be created using the above-referenced techniques for reducing the number of layers in a multilayer signal routing device.

Figure 3:
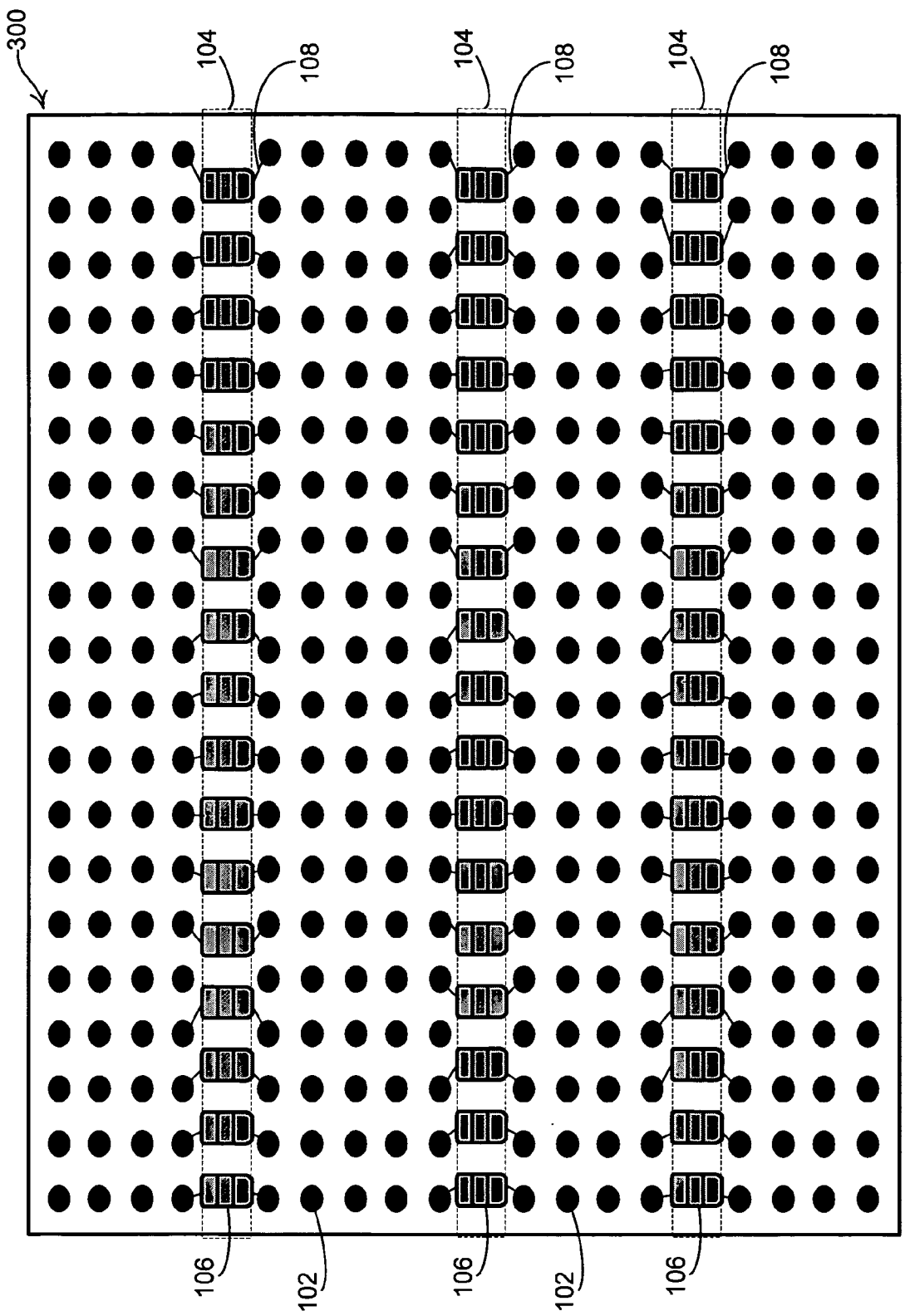
FIG. 3 shows an alternate embodiment of a portion of a secondary side of a multilayer signal routing device having additional electronic components mounted in horizontal signal routing channels in accordance with an embodiment of the present invention.

At this point it should be noted that the signal routing channels 104 may be configured in a variety of ways to achieve the total amount of space that is required to accommodate all of the additional electronic components 106. For example, referring to FIG. 3, there is shown an alternate embodiment of a portion of a secondary side of a multilayer signal routing device 300. In the embodiment of FIG. 3, the signal routing channels 104 are all configured in a horizontal direction for accommodating all of the additional electronic components 106 in a similar horizontal direction.

Figure 4:
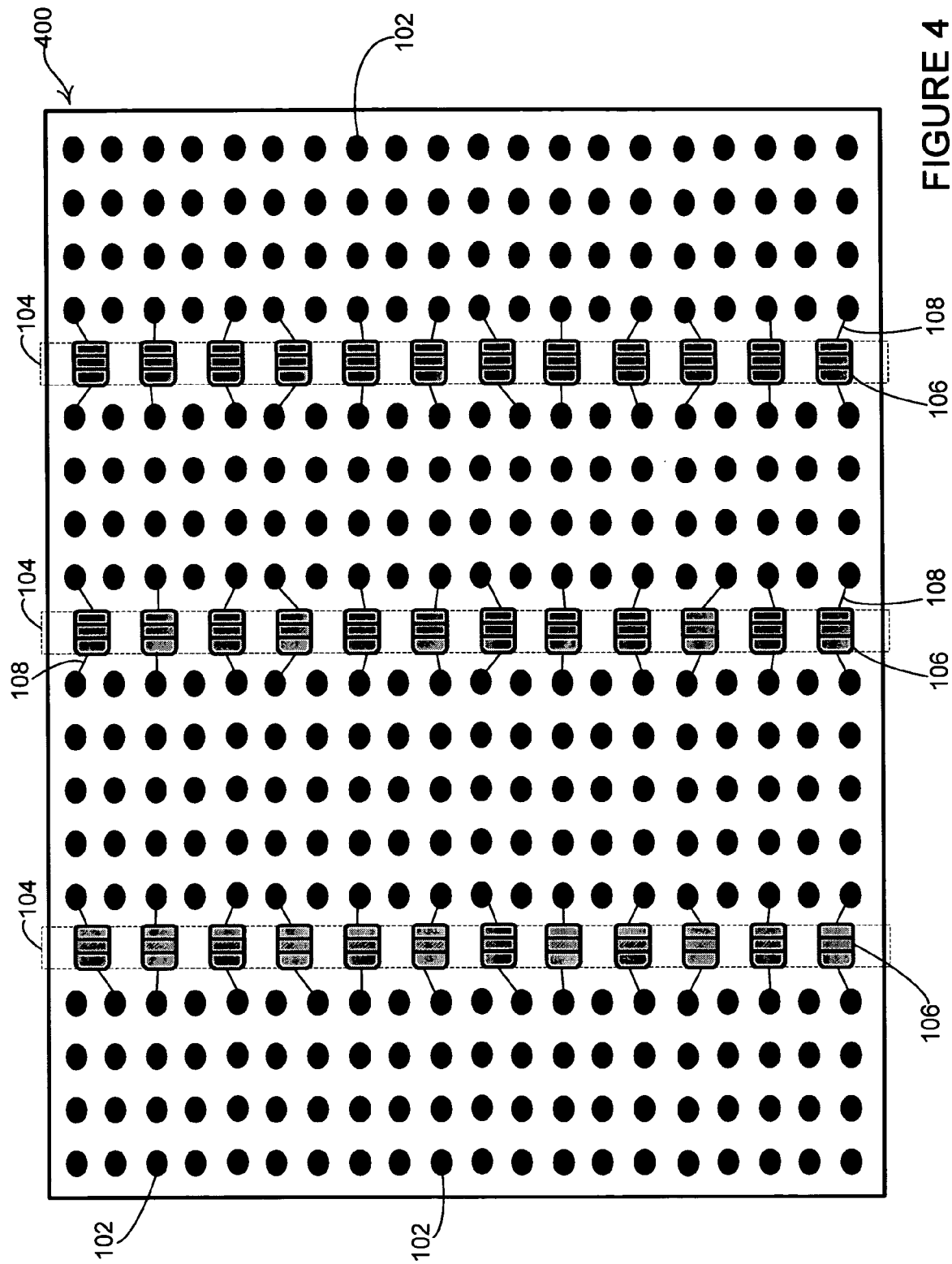
FIG. 4 shows an alternate embodiment of a portion of a secondary side of a multilayer signal routing device having additional electronic components mounted in vertical signal routing channels in accordance with an embodiment of the present invention.

Referring to FIG. 4, there is shown another alternate embodiment of a portion of a secondary side of a multilayer signal routing device 400. In the embodiment of FIG. 4, the signal routing channels 104 are all configured in a vertical direction for accommodating all of the additional electronic components 106 in a similar vertical direction.

Figure 5:
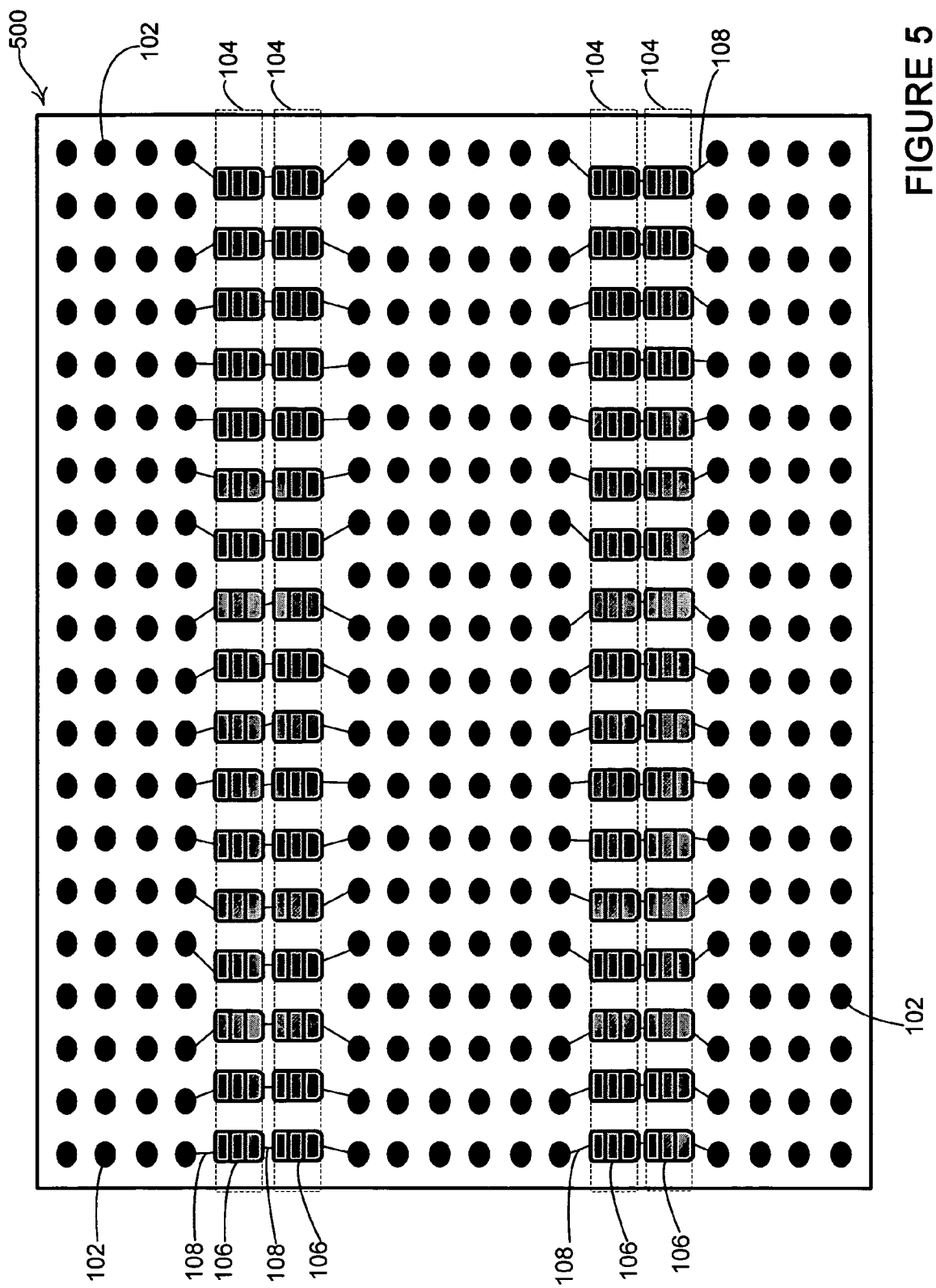
FIG. 5 shows an alternate embodiment of a portion of a secondary side of a multilayer signal routing device having additional electronic components mounted in proximate horizontal signal routing channels in accordance with an embodiment of the present invention.

Referring to FIG. 5, there is shown another alternate embodiment of a portion of a secondary side of a multilayer signal routing device 500. In the embodiment of FIG. 5, the signal routing channels 104 are all configured in a horizontal direction for accommodating all of the additional electronic components 106 in a similar horizontal direction. Also, pairs of the additional electronic components 106 are electrically connected together via electrical connections 108.

Figure 6:
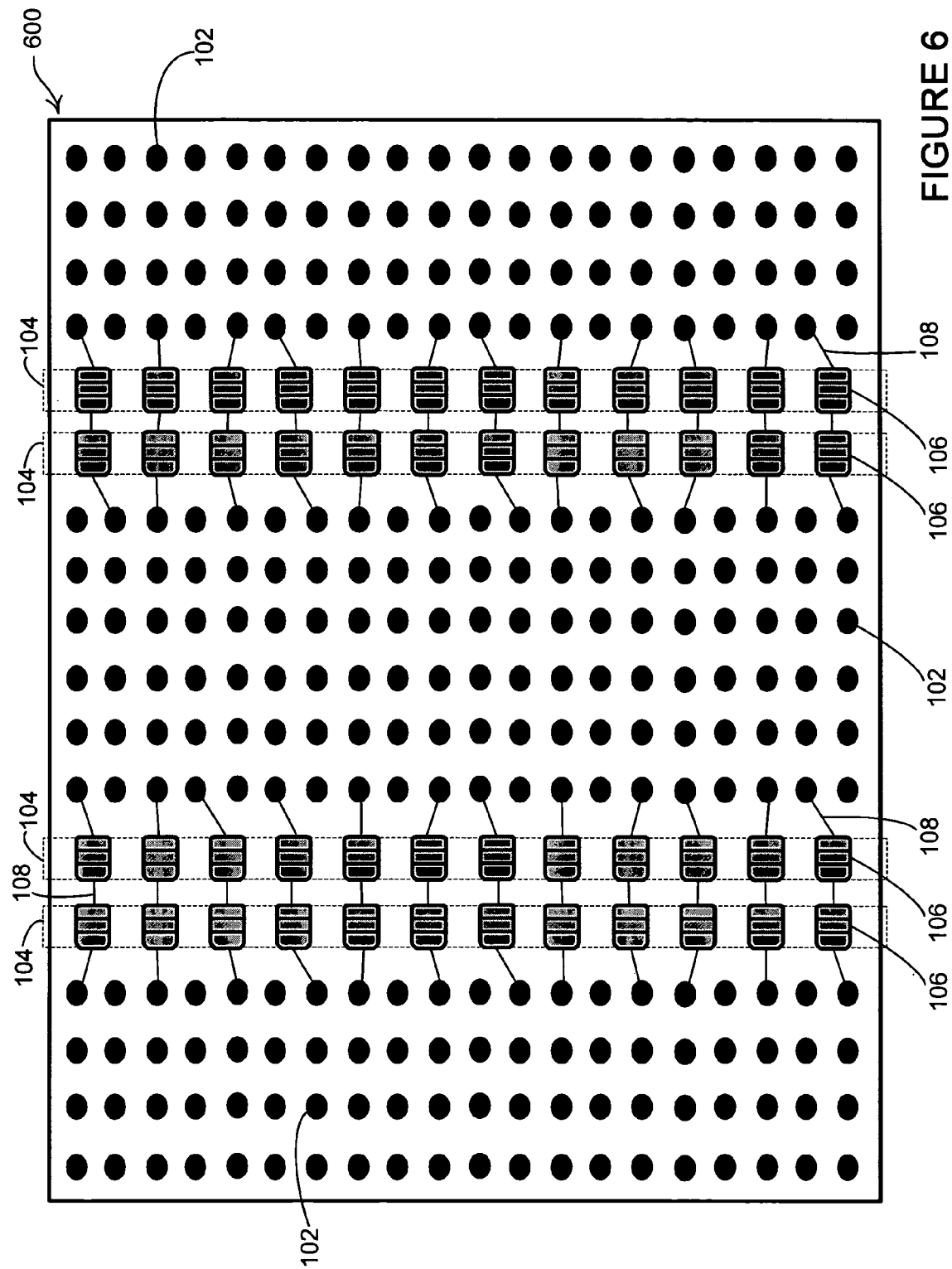
FIG. 6 shows an alternate embodiment of a portion of a secondary side of a multilayer signal routing device having additional electronic components mounted in proximate vertical signal routing channels in accordance with an embodiment of the present invention.

Referring to FIG. 6, there is shown another alternate embodiment of a portion of a secondary side of a multilayer signal routing device 600. In the embodiment of FIG. 6, the signal routing channels 104 are all configured in a vertical direction for accommodating all of the additional electronic components 106 in a similar vertical direction. Also, pairs of the additional electronic components 106 are electrically connected together via electrical connections 108.

Figure 7:
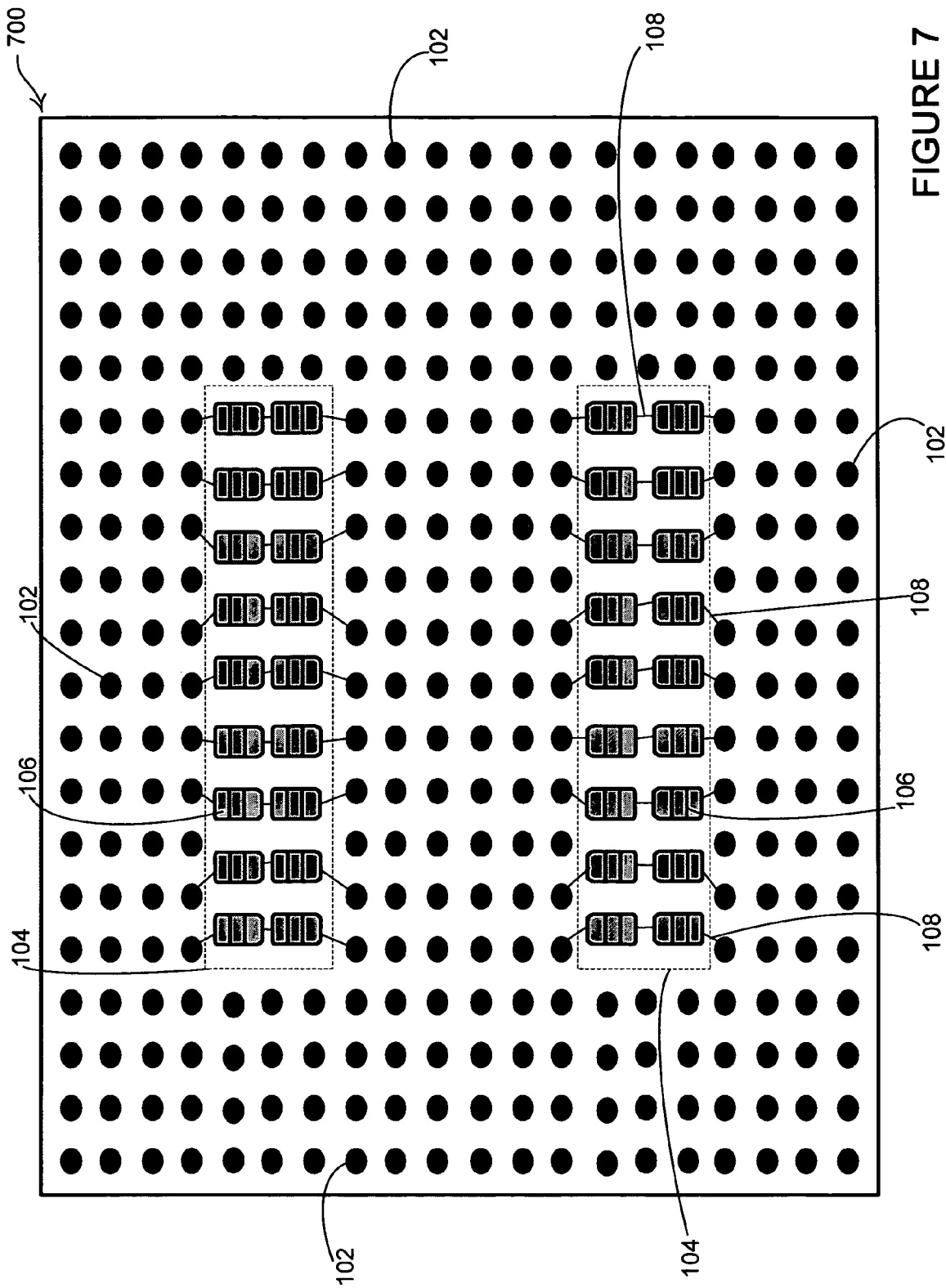
FIG. 7 shows an alternate embodiment of a portion of a secondary side of a multilayer signal routing device having additional electronic components mounted in signal routing channels configured as a pair of rectangular-shaped pockets or cavities in accordance with an embodiment of the present invention.

Referring to FIG. 7, there is shown another alternate embodiment of a portion of a secondary side of a multilayer signal routing device 700. In the embodiment of FIG. 7, the signal routing channels 104 are configured as a pair of rectangular-shaped pockets or cavities surrounded by electrically conductive pads 102 for accommodating all of the additional electronic components 106 within the rectangular-shaped pockets or cavities. Also, pairs of the additional electronic components 106 are electrically connected together via electrical connections 108.

Figure 8:
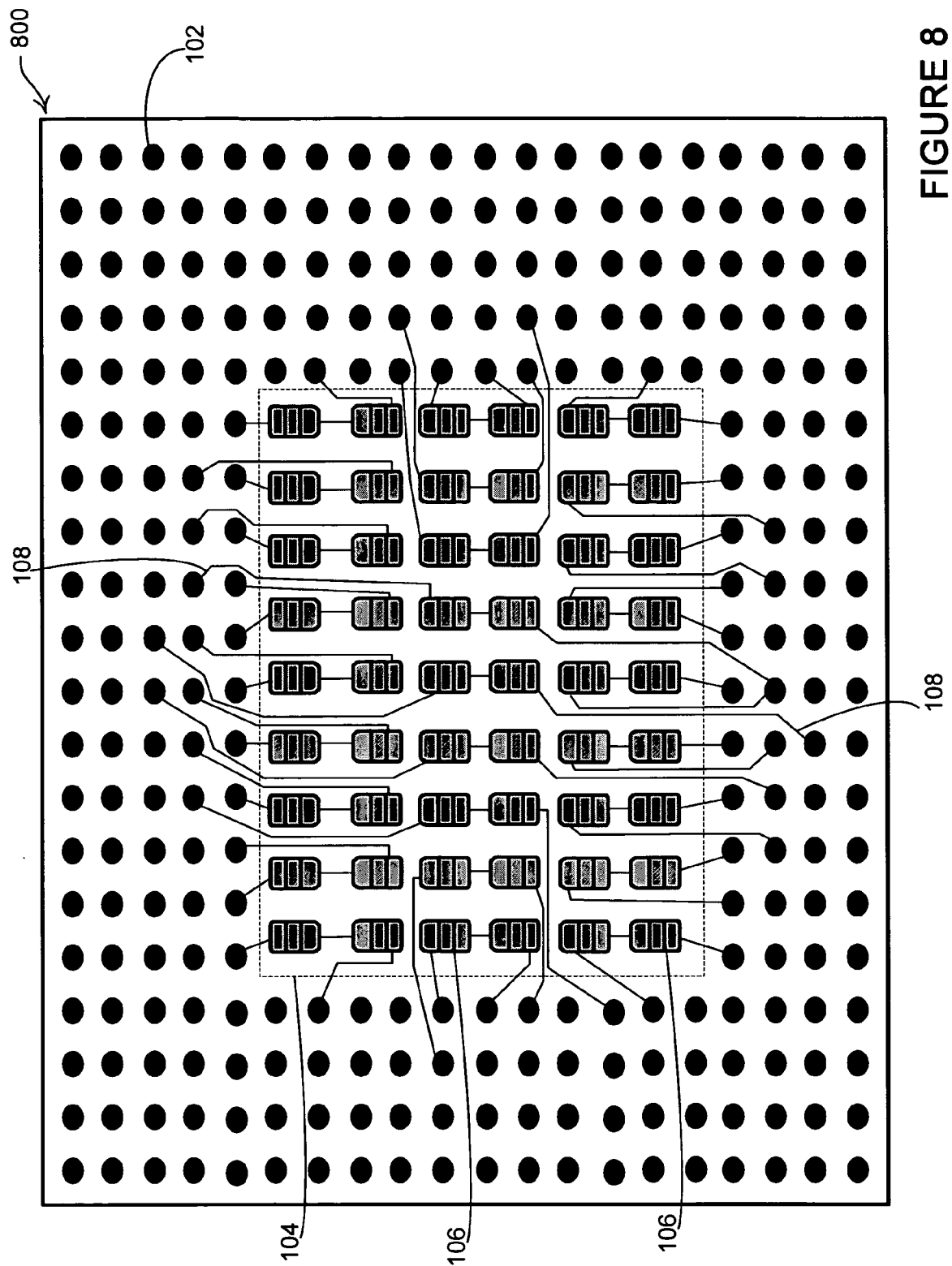
FIG. 8 shows an alternate embodiment of a portion of a secondary side of a multilayer signal routing device having additional electronic components mounted in a signal routing channel configured as a single rectangular-shaped pocket or cavity in accordance with an embodiment of the present invention.

Referring to FIG. 8, there is shown another alternate embodiment of a portion of a secondary side of a multilayer signal routing device 800. In the embodiment of FIG. 8, the signal routing channel 104 is configured as a single rectangular-shaped pocket or cavity (e.g., formed by combining multiple smaller-width signal routing channels) surrounded by electrically conductive pads 102 for accommodating all of the additional electronic components 106 within the single rectangular-shaped pocket or cavity. Also, pairs of the additional electronic components 106 are electrically connected together via electrical connections 108.

Figure 9:
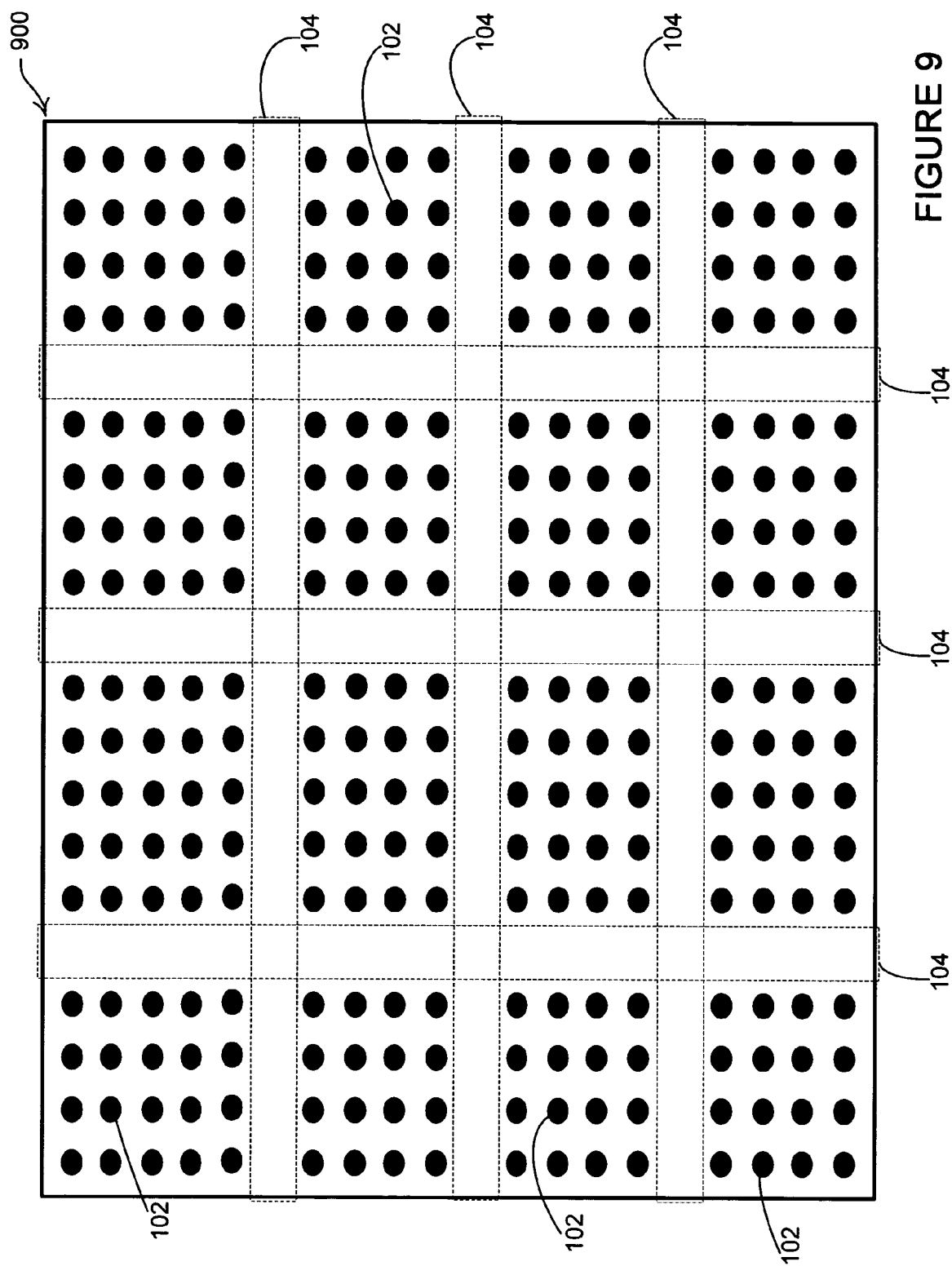
FIG. 9 shows an alternate embodiment of a portion of a secondary side of a multilayer signal routing device having signal routing channels configured in both horizontal and vertical directions for accommodating additional electronic components in both the horizontal and vertical directions in accordance with an embodiment of the present invention.

Referring to FIG. 9, there is shown another alternate embodiment of a portion of a secondary side of a multilayer signal routing device 900 (although without the additional electronic components 106 shown). In the embodiment of FIG. 9, the signal routing channels 104 are configured in both horizontal and vertical directions for accommodating all of the additional electronic components 106 in both the horizontal and vertical directions.

Figure 10:
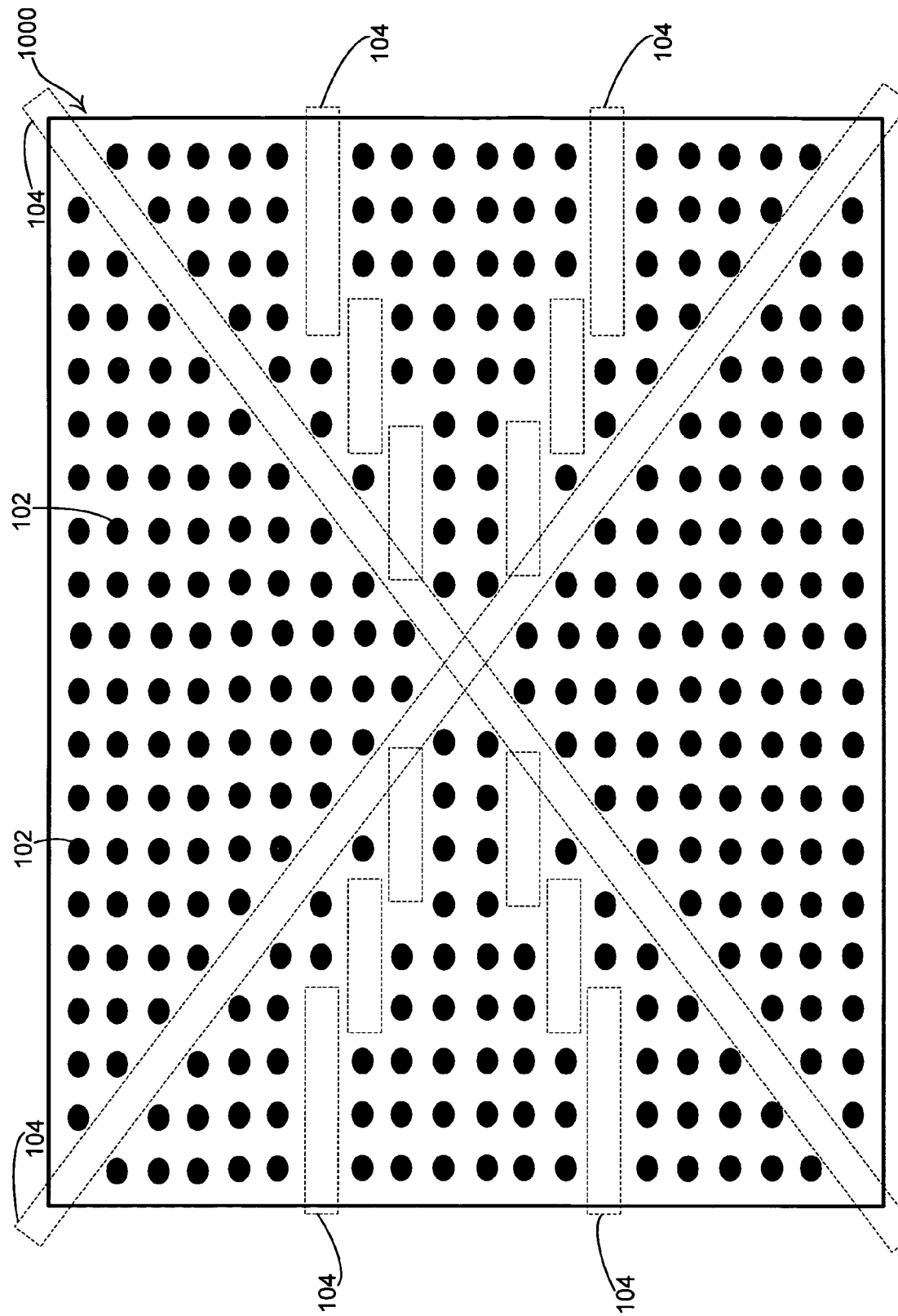
FIG. 10 shows an alternate embodiment of a portion of a secondary side of a multilayer signal routing device having signal routing channels configured in both horizontal and diagonal directions for accommodating additional electronic components in both the horizontal and diagonal directions in accordance with an embodiment of the present invention.

Referring to FIG. 10, there is shown another alternate embodiment of a portion of a secondary side of a multilayer signal routing device 1000 (although without the additional electronic components 106 shown). In the embodiment of FIG. 10, the signal routing channels 104 are configured in both horizontal and diagonal directions for accommodating all of the additional electronic components 106 in both the horizontal and diagonal directions.

Figure 11:
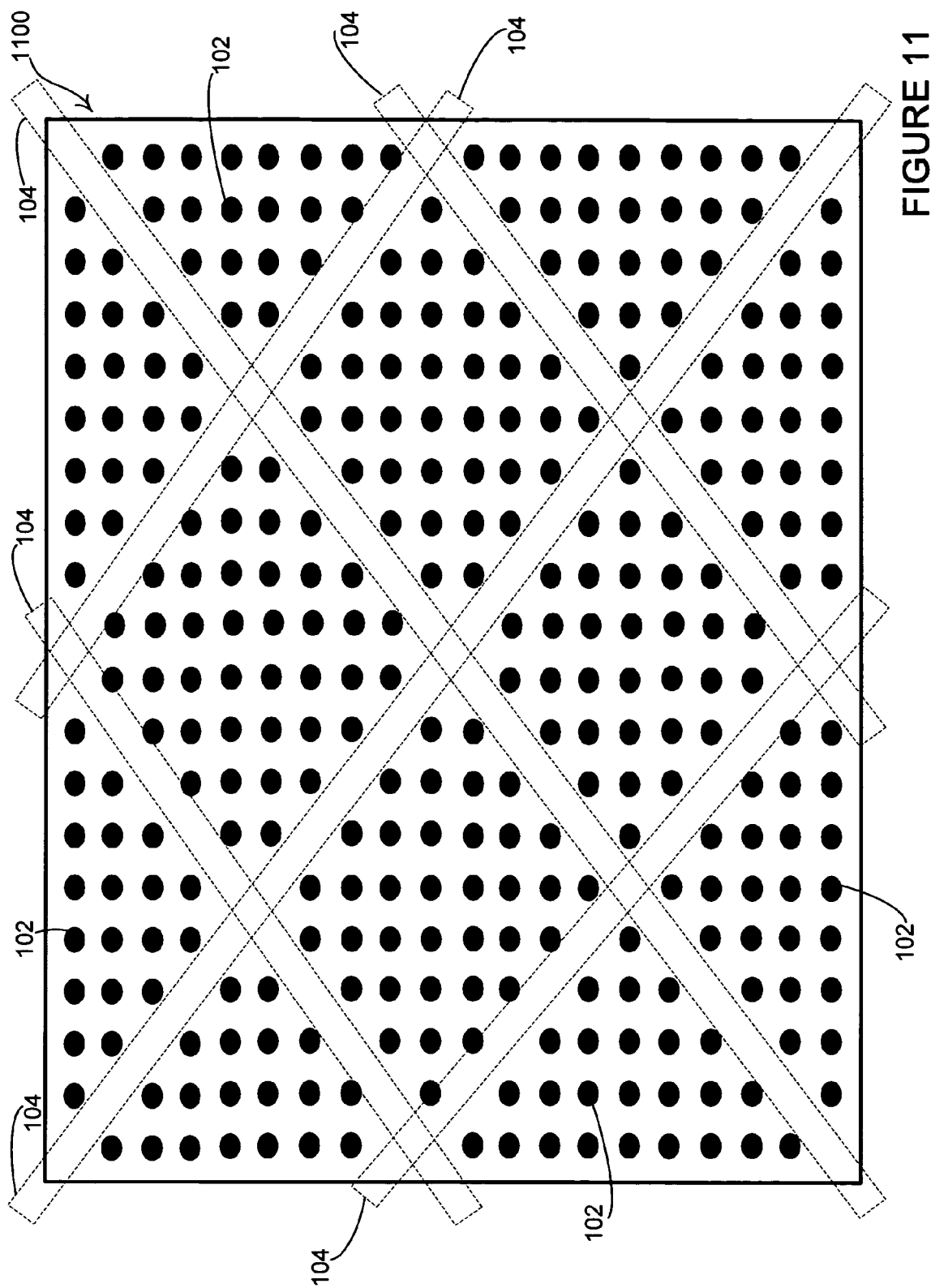
FIG. 11 shows an alternate embodiment of a portion of a secondary side of a multilayer signal routing device having signal routing channels configured in diagonal directions for accommodating additional electronic components in the diagonal directions in accordance with an embodiment of the present invention.

Referring to FIG. 11, there is shown another alternate embodiment of a portion of a secondary side of a multilayer signal routing device 1100 (although without the additional electronic components 106 shown). In the embodiment of FIG. 11, the signal routing channels 104 are configured in diagonal directions for accommodating all of the additional electronic components 106 in the diagonal directions.

Figure 12:
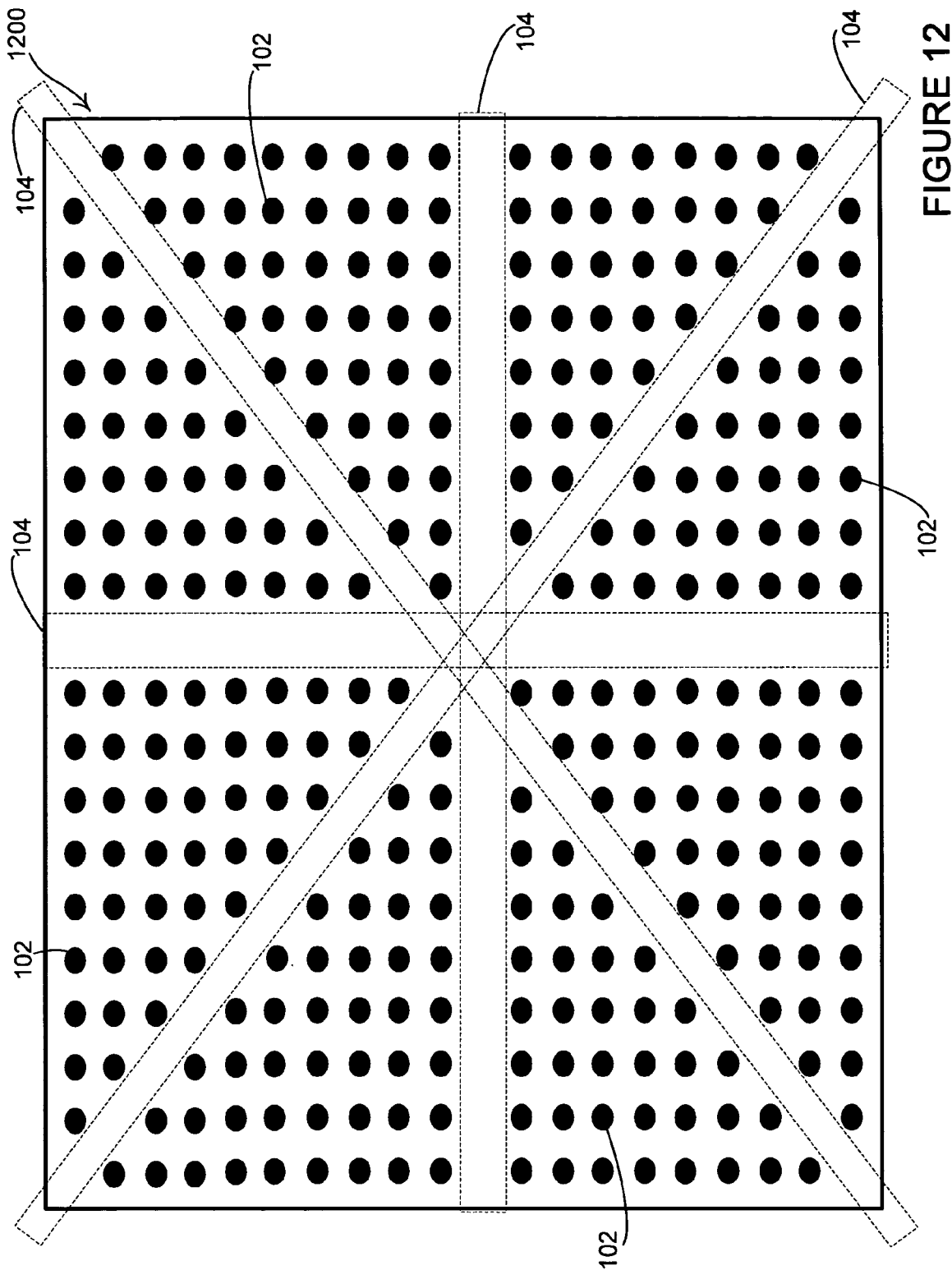
FIG. 12 shows an alternate embodiment of a portion of a secondary side of a multilayer signal routing device having signal routing channels configured in vertical, horizontal, and diagonal directions for accommodating additional electronic components in the vertical, horizontal, and diagonal directions in accordance with an embodiment of the present invention.

Referring to FIG. 12, there is shown another alternate embodiment of a portion of a secondary side of a multilayer signal routing device 1200 (although without the additional electronic components 106 shown). In the embodiment of FIG. 12, the signal routing channels 104 are configured in vertical, horizontal, and diagonal directions for accommodating all of the additional electronic components 106 in the vertical, horizontal, and diagonal directions.

Figure 13:
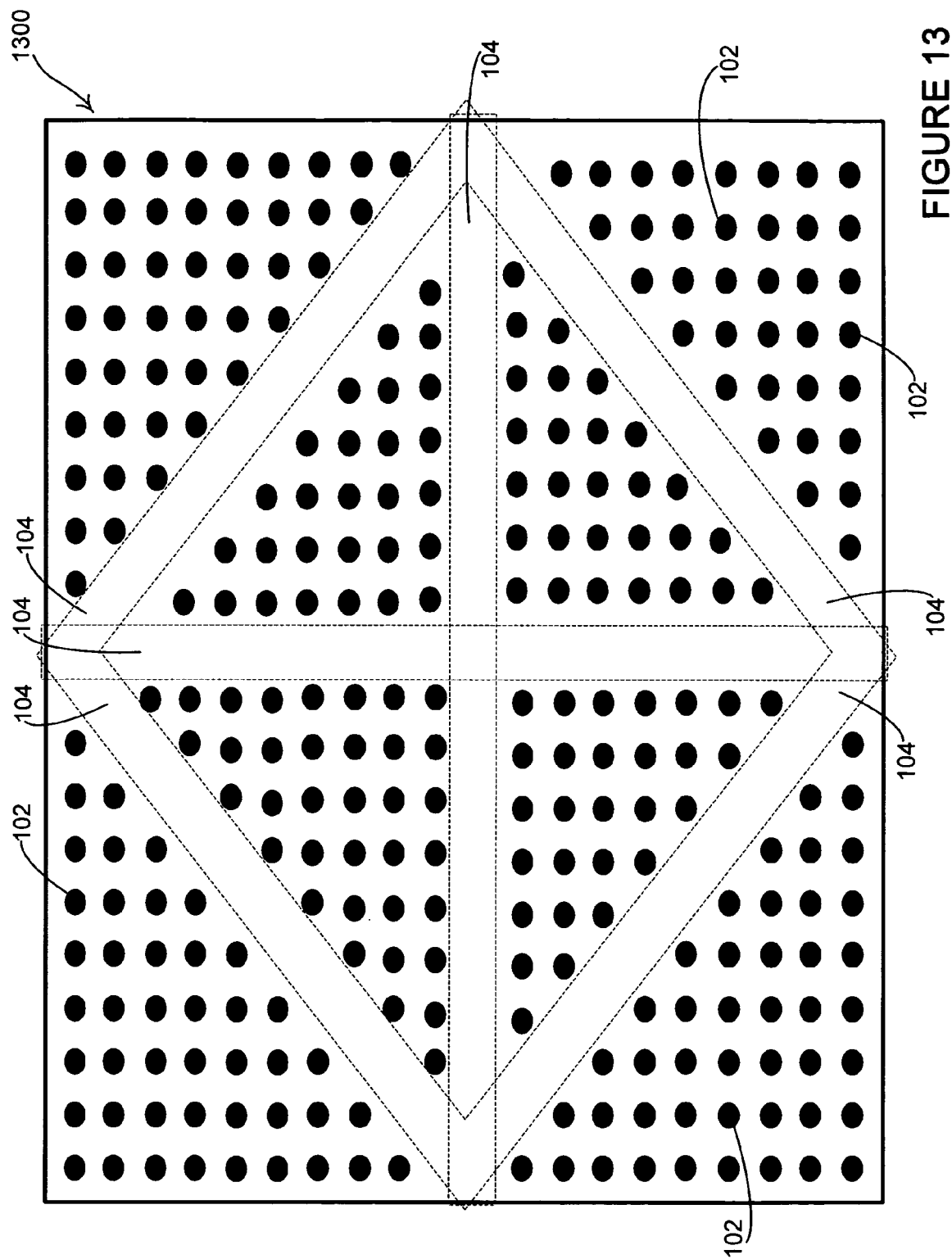
FIG. 13 shows an alternate embodiment of a portion of a secondary side of a multilayer signal routing device having signal routing channels configured in vertical, horizontal, and enclosed diagonal directions for accommodating additional electronic components in the vertical, horizontal, and enclosed diagonal directions in accordance with an embodiment of the present invention.

Referring to FIG. 13, there is shown another alternate embodiment of a portion of a secondary side of a multilayer signal routing device 1300 (although without the additional electronic components 106 shown). In the embodiment of FIG. 13, the signal routing channels 104 are configured in vertical, horizontal, and enclosed diagonal directions for accommodating all of the additional electronic components 106 in the vertical, horizontal, and enclosed diagonal directions.

The present invention is not to be limited in scope by the specific embodiments described herein. Indeed, other various embodiments of and modifications to the present invention, in addition to those described herein, will be apparent to those of ordinary skill in the art from the foregoing description and accompanying drawings. Thus, such other embodiments and modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

The invention claimed is:

1. A method for accommodating electronic components on a multilayer signal routing device, the method comprising the steps of:
   determining a component space that is required to accommodate a plurality of electronic components on a surface of a multilayer signal routing device;
   forming at least one channel on at least the surface of the multilayer signal routing device by not deploying electrically conductive vias in the multilayer signal routing device that extend through at least the surface of the multilayer signal routing device coinciding with a location of the at least one channel, the at least one channel having a channel space that is equal to or greater than the component space; and
   mounting at least a portion of the plurality of electronic components on the surface of the multilayer signal routing device within the at least one channel.

2. The method of claim 1, wherein the step of determining a component space comprises the steps of:
   determining a number of the plurality of electronic components that are to be mounted on the surface of the multilayer signal routing device; and
   determining a required space for each of the number of the plurality of electronic components that are to be mounted on the surface of the multilayer signal routing device.

3. The method of claim 1, wherein the step of forming at least one channel comprises the step of:
   forming at least two relatively aligned electrically conductive microvias in the multilayer signal routing device coinciding with the location of the at least one channel formed on a secondary surface of the multilayer signal routing device.

4. The method of claim 1, wherein the surface of the multilayer signal routing device is a secondary surface of the multilayer signal routing device, wherein a plurality of electrically conductive pads are formed on a primary surface of the multilayer signal routing device opposite the secondary surface of the multilayer signal routing device.

5. The method of claim 4, wherein at least two relatively aligned electrically conductive micro-vias are formed in the multilayer signal routing device in electrical connection with at least two respective ones of the electrically conductive pads and coinciding with the location of the at least one channel formed on the secondary surface of the multilayer signal routing device.

6. The method of claim 5, further comprising the step of: mounting at least a portion of the plurality of electronic components on the secondary surface of the multilayer signal routing device within the at least one channel formed on the secondary surface of the multilayer signal routing device.

7. The method of claim 5, further comprising the step of: forming an electrically conductive pad on the secondary surface of the multilayer signal routing device within the at least one channel formed on the secondary surface of the multilayer signal routing device.

8. The method of claim 7, further comprising the step of: forming an electrically conductive trace on the secondary surface of the multilayer signal routing device electrically connected to the electrically conductive pad formed on the secondary surface of the multilayer signal routing device.

9. The method of claim 7, further comprising the step of: mounting at least one of the plurality of electronic components on the secondary surface of the multilayer signal routing device in electrical connection with the electrically conductive pad formed on the secondary surface of the multilayer signal routing device and coinciding with the position of the at least one channel formed on the secondary surface of the multilayer signal routing device.

10. The method of claim 1, wherein the at least one channel formed on the surface of the multilayer signal routing device has at least one of a vertical, horizontal, and diagonal orientation portion along the surface of the multilayer signal routing device.

* * * * *

UNITED STATES PATENT AND TRADEMARK OFFICE
CERTIFICATE OF CORRECTION

| | | |
|---|---|---|
| PATENT NO. | : 7,107,673 B2 | Page 1 of 1 |
| APPLICATION NO. | : 10/716599 | |
| DATED | : September 19, 2006 | |
| INVENTOR(S) | : Herman Kwong, Luigi Difilippo and Larry Marcanti | |

It is certified that error appears in the above-identified patent and that said Letters Patent is hereby corrected as shown below:

TITLE PAGE, ITEM [54]  Replace "MULTIPLAYER"
With --MULTILAYER--

At Col. 1, line 3, in the title, Replace "MULTIPLAYER"
With --MULTILAYER--.

Signed and Sealed this

Twelfth Day of December, 2006

JON W. DUDAS
*Director of the United States Patent and Trademark Office*